United States Patent [19]

McArdle

[11] Patent Number: 5,696,057

[45] Date of Patent: Dec. 9, 1997

[54] PRODUCING HIGH TC SUPERCONDUCTOR BULK COMPOSITES

[75] Inventor: James L. McArdle, Golden Valley, Minn.

[73] Assignee: Honeywell Inc., Minneapolis, Minn.

[21] Appl. No.: 730,372

[22] Filed: Jul. 11, 1991

Related U.S. Application Data

[63] Continuation of Ser. No. 558,253, Jul. 24, 1990, abandoned.

[51] Int. Cl.$^6$ .................................................. H01L 39/12
[52] U.S. Cl. ............................. 505/1; 505/737; 427/431
[58] Field of Search .......................... 505/1, 736, 739, 505/737; 427/431, 422, 433

[56] References Cited

U.S. PATENT DOCUMENTS

| | | | |
|---|---|---|---|
| 4,801,566 | 1/1989 | Limaye et al. | 501/104 |
| 4,861,753 | 8/1989 | McCarron, III | 505/1 |
| 4,866,030 | 9/1989 | Salomon et al. | 505/1 |
| 4,866,031 | 9/1989 | Bolt et al. | 505/1 |
| 4,906,608 | 3/1990 | Akinc et al. | 505/1 |
| 4,923,849 | 5/1990 | Sherif | 505/1 |
| 4,956,338 | 9/1990 | Rapp et al. | 505/1 |
| 4,971,944 | 11/1990 | Charles et al. | 505/1 |
| 4,983,573 | 1/1991 | Bolt et al. | 505/1 |
| 4,999,322 | 3/1991 | Reick | 501/83 |
| 4,999,338 | 3/1991 | Wijeyesekera et al. | 505/1 |

FOREIGN PATENT DOCUMENTS

| | | | |
|---|---|---|---|
| 6414819 | 1/1989 | Japan | 505/737 |
| 2158013 | 6/1990 | Japan | 505/739 |

OTHER PUBLICATIONS

Chan; Chung, "Superconducting Pastes and Their Application" American Ceramic Society Annual Mtg., Indianapolis, IN Apr. 27, 1989.

Decker et al., "Feasibility of Synthesis of Anisotropic Morphology Ba–Y–Cu–O Powder by Molten Salt Technique" Ceramic Superconductors 2 Research Update, 167–76 Am. Ceram. Soc. Abstract (1988).

Millis et al., "Preparation of y-Ba-Cu-O Powders by Molten Salt Route" IEEE Trans. Magn., 25(2) 2550-2 1989.

"Fabrication of Multiphase Particulate Ceramics by Infiltration into Powder Compacts", Glass, S. Jill and Green, David J., Ceramic Powder-Science II, vol. 1, pp. 784–791 (1987).

"Surface Modification of Ceramics by Partial Infiltration", Glass, S. Jill and Green, David J., Advanced Ceramic Materials, vol. 2, No. (1987).

Millis, R. A. Celikkaya and M. Akinc, "Preparation of $YBA_2CU_3O_7$ Powders by Molten Salt Route", IEEE Transactions on Magnetics, vol. 25, No. 2, pp. 2550–2552, Mar. 1989.

*Primary Examiner*—Karl Group
*Assistant Examiner*—A. Wright

[57] ABSTRACT

Uniformity of the interstitial distribution of the second phase within composite superconducting high $T_c$ ceramic compositions is achieved by infiltrating the second phase from a bath of molten, low melting point, surface wetting, metallic salt introduced after the ceramic microstructure is formed and the superconductor phase fully developed. The metal or metal oxide second phase is formed uniformly in situ by the decomposition of the infiltrated salt and liquification and/or sintering of the residual metal or metal oxide.

11 Claims, 3 Drawing Sheets

PRODUCING HIGH TC SUPERCONDUCTOR BULK COMPOSITES

This is a continuation of application Ser. No. 07/558,253, filed on Jul. 24, 1990 now abandoned.

US GOVERNMENT RIGHTS

The United States Government has contributed to the design and development of the invention herein and, thereby, has acquired ownership of certain rights in the invention.

BACKGROUND OF THE INVENTION

I. Field of the Invention

The present invention is directed generally to enhancing the mechanical and electrical properties of bulk high $T_c$ (critical temperature below which material becomes superconducting) superconductor materials. More particularly, the invention involves an improved process for making the bulk composite superconductor ceramic material in which a metal or metal oxide second phase is introduced and formed in situ after the ceramic microstructure is formed and the superconductor phase is fully developed.

II. Description of the Related Art

The addition of certain second phases has been shown to enhance the mechanical and electrical properties of bulk high $T_c$ (i.e., above about 75° K.) oxide superconductors. In composite dual-phase metal oxide ceramic and metal or metal oxide composite superconductor bulk structures, the metal or metal oxide second phase helps to reduce crack-induced failure of the brittle ceramic materials and, at the same time, aids in preventing surface corrosion of the ceramic by passivating exposed surfaces against air-borne moisture. In addition, the use of an interstitial metal such as silver to partially fill the void space in the porous sintered ceramic composite improves the ability of the material to adhere to electrical contact materials and generally improves the physical workability of the superconductor ceramic.

Traditionally, the dry superconductor components in powder form and of a desired particle size are mixed together with metal or metal oxide powders, typically silver (Ag) or silver oxide (AGO, $Ag_2O$). The mixed powder blend is then formed into the desired shape of the superconductor article. Cold pressing or any other of the many known forming processes may be used to achieve the green precursor body. The shaped mixture is then preferably sintered at high temperature to form the superconducting phase in the ceramic article. While sintering can theoretically be accomplished after considerable time at a lower temperature, the practical sintering temperature is above the melting point of the metal phase so that the solid-state reactions producing the superconductor phases in the ceramic microstructure take place entirely in the presence of a reactive metallic liquid. This produces certain drawbacks in the resulting product. Extended time of exposure to liquid metal at high temperatures can result in excessive grain growth and, in addition, dissolution and incorporation of impurities in superconducting crystallites. It has also been found that in the case of silver or silver oxide (AGO, $Ag_2O$), for example, metallic silver tends to collect in globs or pool in the voids in the sintered microstructure. This occurs because the liquid metal does not wet the surface of the ceramic material. Rather, it tends to collect in isolated pools, driven by surface tension of energetically favorable Ag/Ag interfaces. The resulting interstitial dispersion of the metallic phase within the superconducting phase is decidedly nonuniform. This condition is illustrated by the backscattered electron micrograph of FIG. 2.

Processes have been devised which produce infiltration of a metallic salt into certain other types of ceramic materials. For example, Glass, S. Jill and Green, David J., in "Fabrication of Multiphase Particulate Ceramics by Infiltration into Powder Compacts" on ceramic transaction, Ceramic Powder Science II, Vol. 1, pp. 784–791 (1987) disclose infiltration as a technique for producing multiphase particulate composites in which aluminum nitrate infiltration into porous Y-TZP (yttria-stabilized tegragonal zirconis polycrystal) produces second phase alumina in a resultant Y-TZP/$Al_2O_3$ composite.

With prior processes, however, the superconducting high $T_c$ bulk ceramics exhibit poor mechanical properties, effectively limiting their use for widespread commercial applications. They lack fracture toughness and resistance to crack propagation. Accordingly, there remains a need to improve the mechanical properties and make them more microstructurally uniform. With this in mind, with respect to superconducting high $T_c$ ceramic composites, one goal has been to improve the uniformity of the interstitial distribution of a metal and/or metal oxide second phase within the primary matrix phase in order to produce a more uniform structure with improved, more predictable properties. At the same time, the process should minimize the adverse effects of liquid metal on the superconducting ceramic phase.

SUMMARY OF THE INVENTION

In accordance with the present invention, many of the problems associated with the production of high $T_c$ superconductor bulk composites having a second or secondary distributed metal or metal oxide phase are solved by an unique process in which the metallic or metallic oxide second phase is introduced after the ceramic microstructure is fully developed. In the fully sintered and annealed ceramic state, the porous superconducting primary phase is infiltrated with a molten salt of the metal or metal oxide of interest at a temperature far below the sintering or annealing temperature and, thereafter, the salt is decomposed to produce the desired metal or metal oxide interstitial secondary phase. If desired, the ceramic body may be further heat treated for a period of time as necessary to uniformly interstitially distribute the secondary phase.

The process of the invention involves the preparation of a shaped ceramic article without the metal or metal oxide yielding material and sintering the compact to a degree such that an average density generally less than about 90%–93% of the theoretical (crystal) density of the material is achieved. The material is then annealed at ≈400°–700° C. in an oxygenating medium to infuse oxygen into the system, so as to completely develop the superconducting phase throughout the porous body.

The porous article is then immersed in a molten bath or melt of a selected metal salt, e.g., silver nitrate ($AgNO_3$) (in the case of an Ag/Y-Ba-Cu-O composite, for example, described below), which forms a stable, fluid melt at a relatively low temperature, i.e., less than about 250° C. ($AgNO_3$ melts at about 210° C.) and decomposes at a relatively low temperature, i.e., less than at about 500° C. ($AgNO_3$ decomposes at about 400° C.). The infiltration step may be accomplished under ambient or, alternatively, under applied hydrostatic pressure and can be repeated several times to increase the fraction of metal salt contained in the body.

The salts which may be used in the process of the invention, then, include those metal salts which form a stable melt at relatively low temperature, i.e., ≲ about 250° C. and which wet the ceramic material and which decompose to the desired metal or metal oxide upon heating at a relatively low temperature, i.e., ≲ about 500° C. Generally the temperature of decomposition for the salt, or intermediate precursor formed from the salt to form the desired oxide or metallic phase, should be below a temperature which affects the grain structure of the sintered, annealed ceramic material within the time of exposure.

The infiltrated body is then heated slowly to decompose the metal salt leaving secondary phase particles dispersed throughout the porous structure. The infiltrated body, in the case of a low melting point metal such as silver, can then be heated briefly above the melting point of the metal, if desired, to liquify the metal and produce a continuous metal phase throughout the porous structure of the superconducting ceramic. The short duration of this optional final heat treatment limits grain growth and prevents excessive reaction between the ceramic matrix and the metal phase.

The process or technique of the present invention, it is believed, can successfully be used with any ceramic material of the class described including any of the known families of superconducting ceramic oxide materials in any of their forms. These families include:

R-Ba-Cu-O where R=e.g., Y, La, and other lanthanide series or rare earth elements Bi-Sr-Ca-Cu-O where the material may be lead modified or Pb may be substituted for Bi Tl-Ca-Ba-Cu-O and variations thereof The secondary phase may be either metallic or in the form of an oxide. Preferred oxides include CuO, MgO, $Cr_2O_3$, $Al_2O_3$ and $ZrO_2$. The metallic secondary phase improves both electrical and mechanical properties while the oxide secondary phases enhance mechanical properties.

With respect to the above, specifically, yttrium barium copper oxide ceramics have been successfully treated utilizing the process of the invention. It should be noted that the preferred metallic salts to be infused into the yttrium barium copper oxide sintered metallic oxide superconducting compounds include low melting point silver salts such as silver nitrate ($AgNO_3$), etc., which typically melt and decompose to the metal through an oxide precursor salt form, AgO or $Ag_2O$. These materials can be heated in air without being affected by ambient atmosphere and both melt and decompose at a temperature below that which would melt the pure metal. The precursor oxide is normally decomposed by heating slowly up to the melting point and thereafter rapidly to the decomposition temperature to reduce the exposure of the ceramic to the liquid salt phase. Subsequent melting of the metal particles, if desired, can help to produce a uniform second phase through the composite. Overall, the process greatly improves the properties and the uniformity of properties in the superconducting material.

BRIEF DESCRIPTION OF THE DRAWINGS

In the drawings wherein like numerals are utilized to designate like parts through the same.

DETAILED DESCRIPTION

As discussed above, the addition of certain secondary phases has been shown to enhance the mechanical and electrical properties of sintered bulk high $T_c$ oxide superconductors. However, there has been a great deal of difficulty in achieving both a uniform dispersion of the second or metallic phase throughout the interstices of the ceramic grain structure and the formation of high density, fine grained microstructure. Specifically, it has been found that excessive grain growth, dissolution and incorporation of impurities in the superconducting crystallites occurs with the exposure of the superconductor phases to a reactive metal liquid for any amount of time. The present invention addresses these problems by introducing the second or secondary phase after the sintering step when the ceramic microstructure of the superconductor is fully formed and the superconductor phase is developed.

Figure 3:
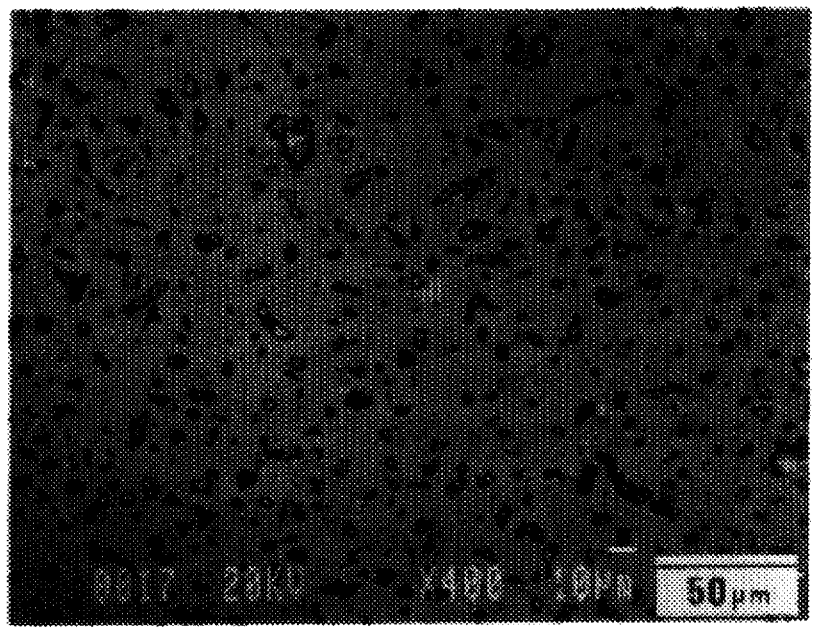
FIG. 3 is a backscattered electron micrograph of $YBa_2Cu_3O_{7-x}$ (0≦x≦1) ceramic sintered at 950° C. prior to infiltration, showing connected porosity and a well-defined, acicular grain morphology.

The process of the present invention will be described in detail with respect to the diagram of FIG. 1. A specific embodiment is shown in the accompanying backscattered electron micrographs of FIGS. 3 and 4. This embodiment is meant to be illustrative and exemplary rather than limiting as to the scope of the invention.

Figure 1:
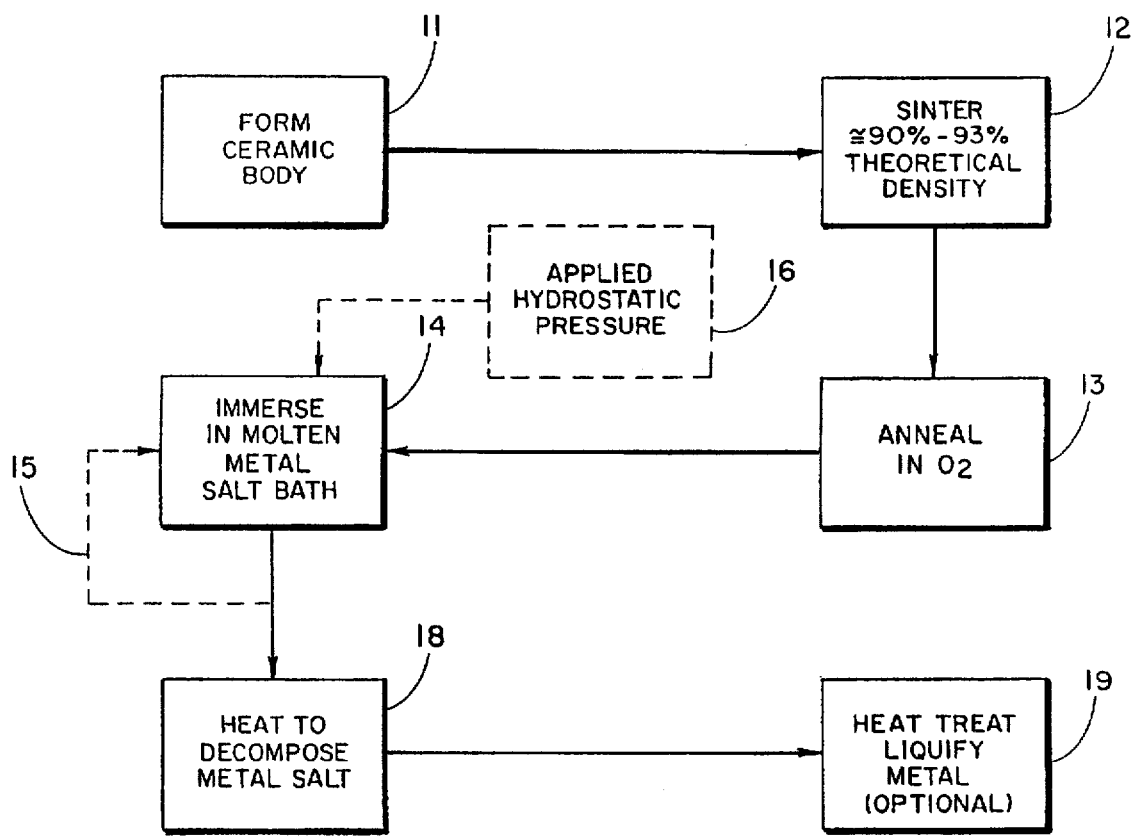
FIG. 1 is a schematic representation of the steps in the process of the invention.

FIG. 1 depicts in schematic or block diagram of the major steps in the process of the invention. As shown at 11, a precursor body of the desired primary superconducting phase is first prepared. This body may be of a single oxide superconductor powder material or any compatible blend of such materials which will achieve the properties of bulk high critical temperature, or high $T_c$, oxide superconductor required for particular application. The superconductor body is formed into the desired shape prior to sintering. Any desired method of forming the precursor or green shaped body as would occur to those skilled in the art including powder compaction, liquid solution or slurry techniques may be used. The sinter step 12 is carried out in a temperature range and pressure range and for a length of time in those ranges required to achieve less than about 90% to 93% of the theoretical density of the material were it to fill the entire space. The sintered bulk ceramic material is then annealed in oxygen, or other suitable oxygenating medium, as at 13 so as to completely develop the superconducting phase throughout the porous body structure. The purpose of this step is to infuse oxygen into the structure to produce the superconducting phase.

It has been found that with a sintered porous bulk density below about 90% to 93%, porosity is continuous and connected to the surface such that the oxygen may permeate and completely envelop the internal structure in order to develop the superconducting phase throughout the porous body. This phenomenon is also important with respect to the later uniform infiltration of metal salt. An example of a successful embodiment using $YBA_2Cu_3O_{7-x}$ ($0 \leq x \leq 1$) at the stage just prior to salt infiltration appears in the backscattered electron micrograph of FIG. 3. The relatively uniform, well-defined structure is noteworthy.

In the step at 14, the porous body is immersed in a molten bath of selected metal salt under ambient, or alternatively, under applied hydrostatic pressure 16. The metal salt selected, for example, silver nitrate, should be one which forms a stable fluid melt at a relatively low temperature, i.e., less than 250° C. At these temperatures, no change is effected in the formed bulk ceramic grain structure. This salt is also normally selected to be one which preferably wets the ceramic surface and one which readily decomposes to the desired metallic or oxide form. As shown in the diagram of FIG. 1 at 15, this step can be repeated as many times as is necessary to produce the fraction of metal salt retained in the open porous structure to the amount desired, up to the limit where continuous pore channels are closed off by the infiltrated phase.

The infiltrated body is then heated, as shown at 18, slowly to decompose the metal salt, forming fine metal or metal oxide particles inside the continuous pore channels. In this manner, the secondary phase is introduced into the ceramic after the ceramic is fully formed and is distributed uniformly throughout the structure. The metallic salt chosen to distribute the metal or metal oxide second phase into the structure is also one which readily decomposes leaving the desired pure metal or metal oxide residue. In the case of the oxide phase, infiltration is accomplished with a precursor which decomposes to a stable oxide phase, e.g., $CuNO_3 \rightarrow CuO$, $Mg(C_2H_4O_2)_2 \rightarrow MgO$, etc. In the case of Ag/YBCO composite, silver nitrate has been used with great success. The phenomena involved in the formation of the secondary phases are not fully known. The decomposition reactions of calcination of silver nitrate and silver oxide to the metallic silver, for example, are quite complex and are still being studied and analyzed. Most other metal salts decompose to an oxide or oxidized form.

It should be noted that it is desirable to minimize the amount of time the superconducting bulk ceramic material is exposed to the infiltrated salt, such as silver nitrate, in the liquid phase because the salt, in the liquid phase, is corrosive to the ceramic material. Because of this, it is desirable to heat the material containing the infused salt more rapidly once the melting point of the infused salt is reached. Silver nitrate, for example, melts at ~210° C. and decomposes at approximately 400° C. In this manner, the ceramic body would be heated quickly in the range of about 200° C. to 400° C. to reduce the amount of time that the ceramic material would be exposed to the liquid phase of the silver nitrate.

It should further be noted that the use of a salt material such as $AgNO_3$ to distribute the metallic material throughout the structure at low temperature after sintering, presents still an additional advantage. The silver salt, for example, $AgNO_3$, in the molten state, wets the surface of the ceramic material, thus promoting uniform infiltration of the molten salt into the porous superconducting matrix. Whereas, metallic silver does not wet the surface of the ceramic. This still further increases the uniformity of distribution of the material throughout the structure.

The final, optional step shown in FIG. 1 at 19 involves the brief heat treatment of the infiltrated body above, in this case, the melting point of the metal phase to produce a continuous metal phase throughout the pore structure of the superconducting ceramic. The short duration of this optional treatment step limits the grain growth and prevents excessive reaction between the ceramic matrix and the metal phase. The metal particles remaining from the decomposition of the metallic salt are uniformly distributed throughout the pore structure since the liquid salt material had wet the surface of the ceramic. This, in turn, assures uniform distribution of the metallic phase after the final heat treatment step.

Figure 4:
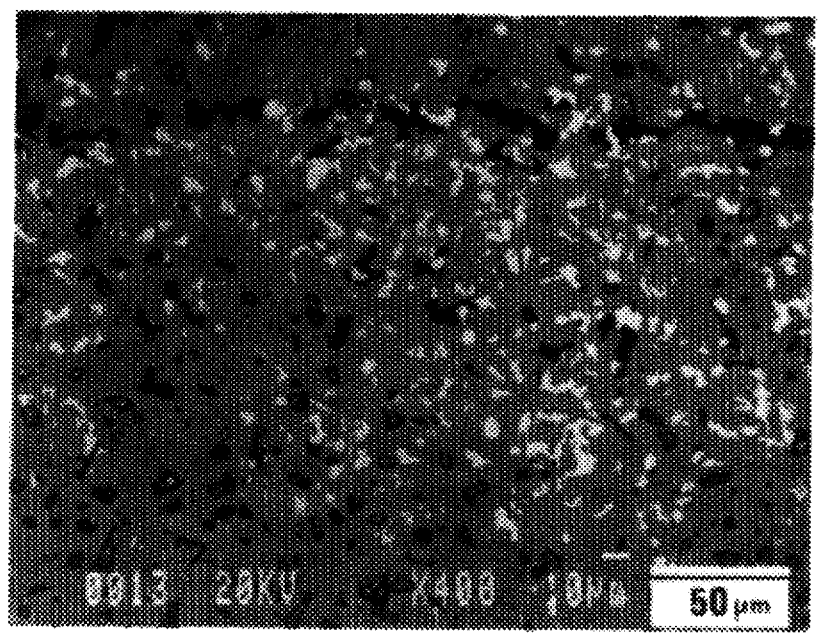
FIG. 4 is a backscattered electron micrograph of sintered $Ag/YBa_2Cu_3O_{7-x}$ (0≦x≦1) composite formed by the process of the invention showing little evidence of grain growth; the well-dispersed metallic silver phase, revealed in bright contrast in the micrograph, was confirmed as silver by elemental analysis in the electron microscope.

FIG. 4 illustrates the $YBa_2Cu_3O_{7-x}$ composite as formed by the process of the invention. The silver appears well-dispersed and the entire structure more uniform than that of the prior art. The electron micrograph of FIG. 4 shows very little evidence of grain growth with respect to FIG. 3.

Figure 2:
FIG. 2 is a backscattered electron micrograph of $Ag/YBa_2Cu_3O_{7-x}$ (0≦x≦1) composite. The sample was fabricated by sintering a mixture of AgO and component superconductor oxides at 950° C. which is typical of the prior art; the microstructure exhibits excessive grain growth and non-uniform distribution of silver phase.

The metallic phase formed utilizing the old process illustrated in FIG. 2 in which the metallic salt was added prior to sintering, on the other hand, as mentioned above, results in the formation of rather large pools of metal within the structure which is highly undesirable. This occurs because the surface tension of the metal causes the liquified metal to collect in large isolated pockets within the ceramic microstructure.

The invention has been described herein in considerable detail in order to comply with the Patent Statutes and to provide those skilled in the art with the information needed to apply the novel principles and to construct and use such specialized components as are required. However, it is to be understood that the invention can be carried out using specifically different materials, equipment and devices and that various modifications can be accomplished without departing from the scope of the invention itself.

What is claimed is:

1. A process for modifying formed articles of superconducting ceramic compositions that changes the single phase superconducting ceramic compositions to bulk composite materials having a dual phase, superconducting and non-superconducting, microstructure of generally uniform distribution resistant to fracture and crack propagation comprising the steps of:

providing a formed sintered, porous body matrix of bulk ceramic material having a bulk density $\leq 93\%$ of the theoretical density, having generally continuous pore channels throughout the structure and exhibiting superconducting properties at or below a cryogenic critical temperature ($T_c$);

contacting the porous body of bulk ceramic material with an amount of molten material containing one or more molten metallic salts selected from a group consisting of salts which form a fluid melt below 250° C., decompose below 500° C. to a form selected from the group consisting of the metal and an oxide of the metal, and exhibit a surface tension in the molten form which allows them to wet the interior surfaces of the bulk ceramic material in a manner such that the salt material is distributed throughout the ceramic matrix;

heat treating the porous ceramic body carrying the infiltrated salt to effect in situ decomposition of the salt and form an interstitial non-superconducting phase of material selected from metal and metal oxides generally uniformly distributed throughout the pore channels of the ceramic superconductor matrix.

2. The method of claim 1 wherein the non-superconducting phase is a metal phase.

3. The method of claim 1 wherein the formed porous bulk ceramic superconductor material consists substantially of one or more materials selected from:

R-Ba-Cu-O where R is selected from the group consisting of Y, La, and other lanthanide series rare earth elements, R'-Sr-Ca-Cu-O where R' is selected from the group consisting of Bi, Pb and combinations thereof, and Tl-Ca-Ba-Cu-O.

4. The method of claim 3 wherein the metallic salt is a superconductor material consists substantially of:

$YBa_2Cu_3O_{7-x}$ $0 \leq x \leq 1$.

5. The method of claim 3 wherein the metallic salt is a silver salt.

6. The method of claim 5 wherein the metallic salt is $AgNO_3$.

7. The method of claim 4 wherein the metallic salt is $AgNO_3$.

8. The method of claim 4 wherein the value of x is about 0.2.

9. The method of claim 6 wherein the value of x is about 0.2.

10. The method of claim 2 wherein the metal oxide is selected from CuO, MgO, $Cr_2O_3$, $Al_2O_3$ and $ZrO_2$.

11. The method of claim 2 further comprising the step of heat treating the body briefly above the melting point of the metal to produce a continuous metal phase dispersed throughout the interstices of the pore structure of the superconducting ceramic.

* * * * *